United States Patent [19]

Chou et al.

[11] Patent Number: 5,656,414
[45] Date of Patent: Aug. 12, 1997

[54] METHODS OF FORMING TALL, HIGH-ASPECT RATIO VIAS AND TRENCHES IN PHOTO-IMAGEABLE MATERIALS, PHOTORESIST MATERIALS, AND THE LIKE

[75] Inventors: William Tai-Hua Chou; Wen-chou Vincent Wang, both of Cupertino, Calif.

[73] Assignee: Fujitsu Limited, Japan

[21] Appl. No.: 52,639

[22] Filed: Apr. 23, 1993

[51] Int. Cl.$^6$ .................................... G03C 5/00
[52] U.S. Cl. .................. 430/312; 430/269; 430/325; 430/326; 430/330; 430/324; 430/394
[58] Field of Search .................. 430/326, 330, 430/325, 324, 394, 312, 269

[56] References Cited

U.S. PATENT DOCUMENTS

| | | | |
|---|---|---|---|
| 4,550,069 | 10/1985 | Pampalone | 430/165 |
| 4,564,584 | 1/1986 | Fredericks et al. | 430/312 |
| 4,568,631 | 2/1986 | Badami et al. | 430/315 |
| 4,657,629 | 4/1987 | Bigelow | 430/313 |
| 4,835,086 | 5/1989 | Jain | 430/326 |
| 4,859,573 | 8/1989 | Maheras et al. | 430/326 |
| 4,863,827 | 9/1989 | Jain et al. | 430/145 |
| 4,904,564 | 2/1990 | Chiong | 430/156 |
| 4,908,298 | 3/1990 | Hefferon et al. | 430/313 |
| 4,980,270 | 12/1990 | Inasaka | 430/312 |
| 5,019,488 | 5/1991 | Mammato et al. | 430/325 |
| 5,066,567 | 11/1991 | Merrem et al. | 430/325 |
| 5,186,788 | 2/1993 | Hashimoto et al. | 430/325 |
| 5,240,807 | 8/1993 | Jain et al. | 430/326 |

OTHER PUBLICATIONS

"KTI 875 DualTone Resist Processing," Process Application Note, KTI Chemicals, Inc. (PAN-30-91-02-2000). It is believed that this reference was published before Jan. 1, 1993.

"KTI 875 DualTone Resist," Process Application Note, KTI Chemicals, Inc. (PAN-29-91-03-2000). It is believed that this reference was published before Jan. 1, 1993.

"AZ®5200 Positive Photoresists," Technical Data Sheet, Hoechst (PB52HP7127RO). It is believed that this reference was published before Jan. 1, 1993.

"AZ®4000 Series Photoresists for Thick Film Applications," Technical Data Sheet, Hoechst PBTFAP6008RO). It is believed that this reference was published before Jan. 1, 1993.

*Primary Examiner*—George F. Lesmes
*Assistant Examiner*—Laura Weiner
*Attorney, Agent, or Firm*—Coudert Brothers

[57] ABSTRACT

Simple and cost-effective methods for forming tall, high-aspect ratio structures in a material layer comprising a first layer of a image-reversal-type photo-sensitive material and a second layer of a positive-type photo-sensitive material is disclosed. The layers are formed, exposed to actinic radiation, and developed such that the formation, exposure, and development of the second layer does not substantially modify or destroy the patterns formed in the first layer. In one embodiment, the first layer is exposed to actinic radiation through a first mask comprising the complimentary image, or negative, of a desired high-aspect ratio structure. The image in the first layer is then reversed by heating to an elevated temperature and subsequently blank flood exposure of actinic radiation. A second layer of a positive type photo-sensitive material chemically compatible with the IRP layer is then formed over the first layer. The second layer is exposed to actinic radiation through a second mask comprising the positive image of the desired structure. Both layers are exposed to a developer solution to remove material from the layers, thereby completing the formation of the desired structure.

20 Claims, 6 Drawing Sheets

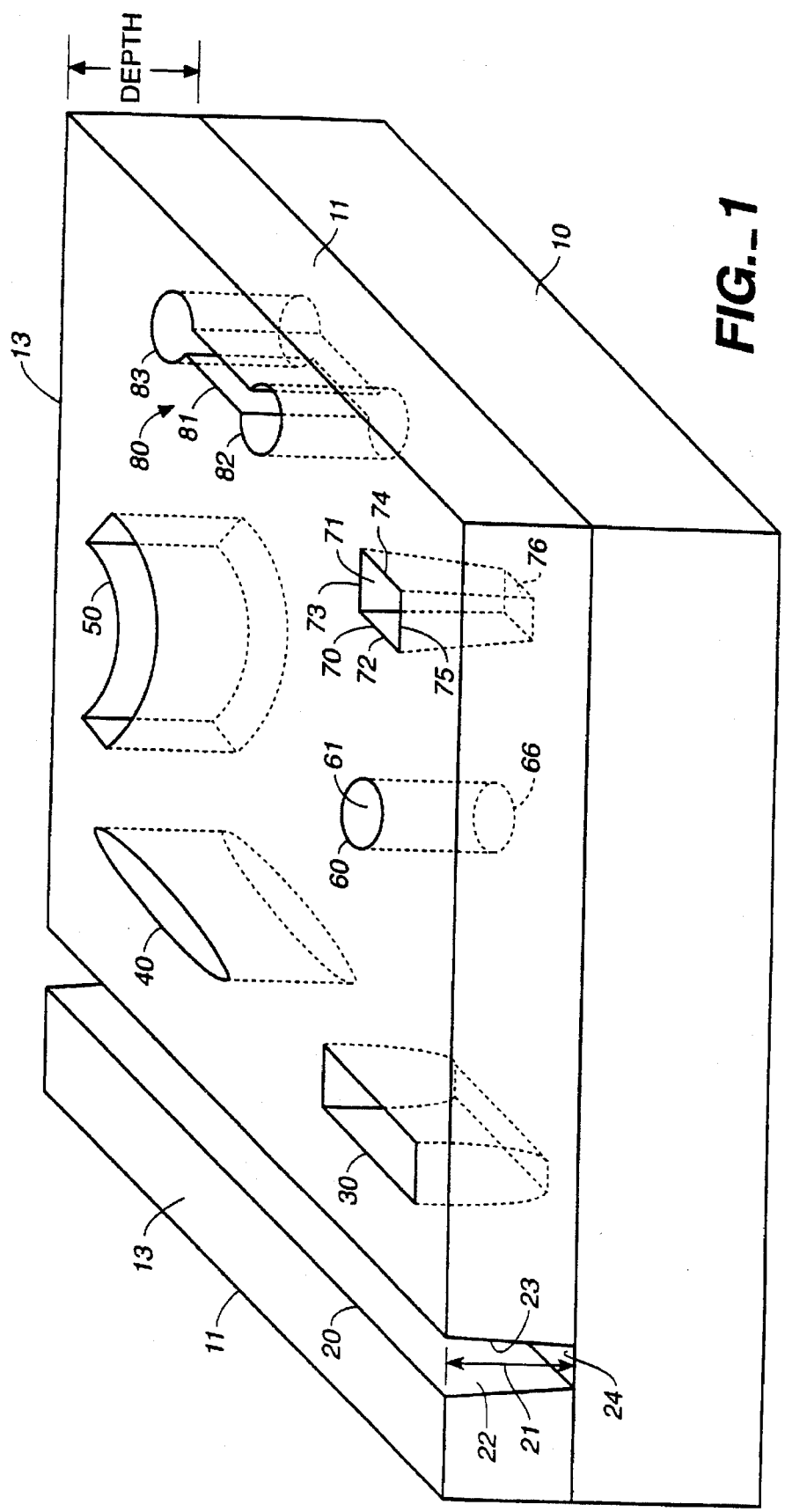
FIG._1

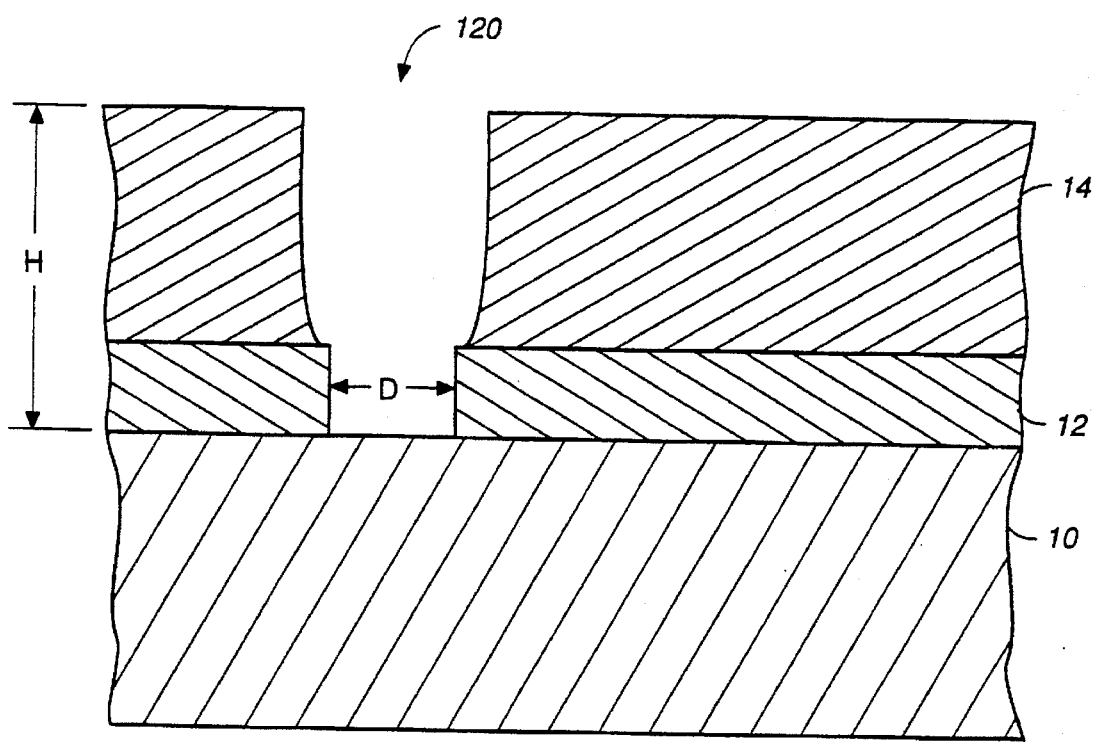
FIG._2

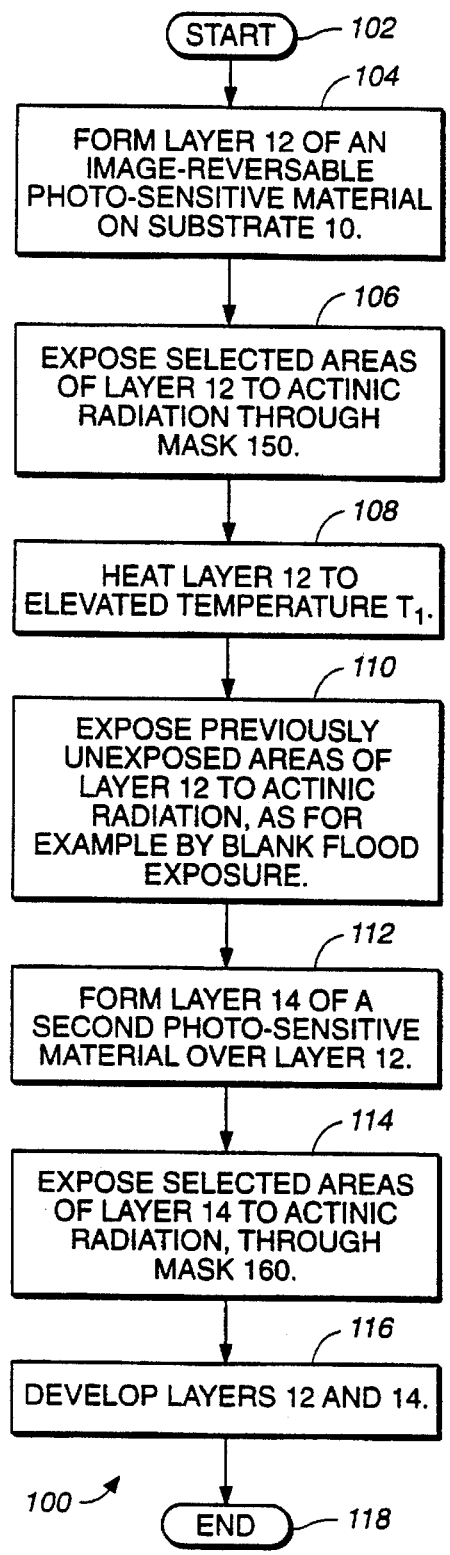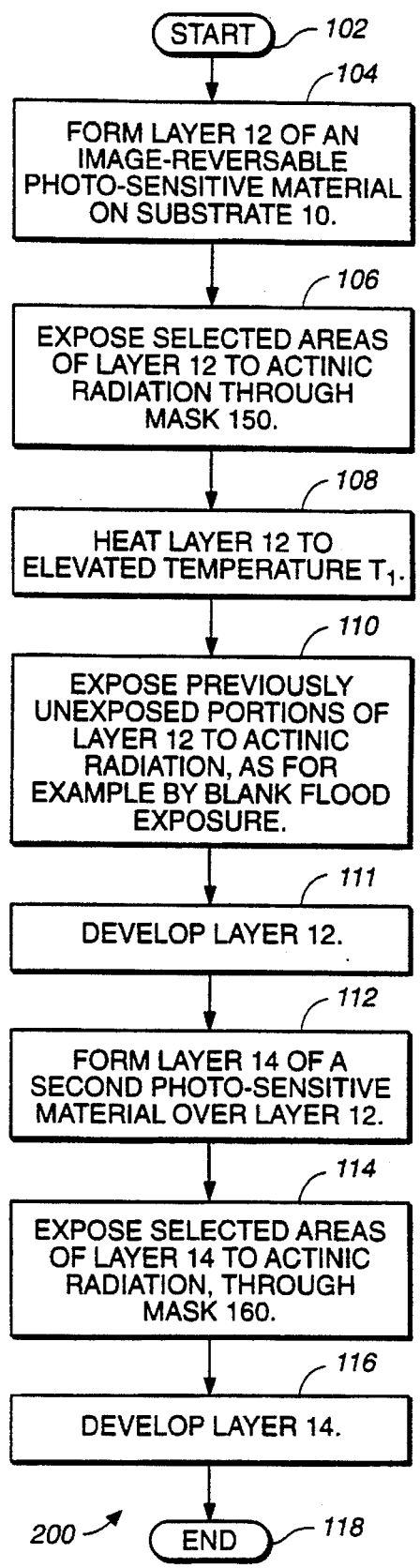
FIG._3     FIG._4

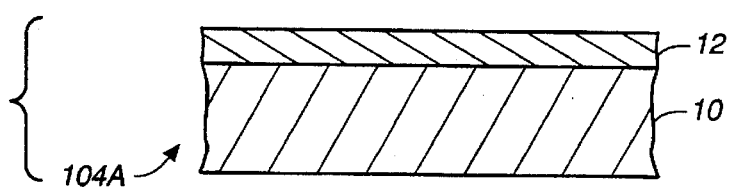
*FIG._3A*
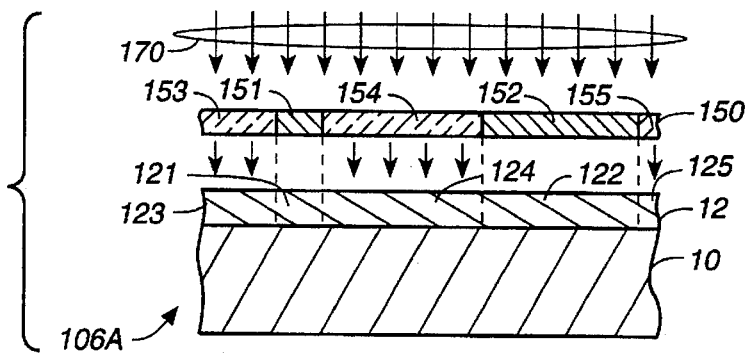
*FIG._3B*
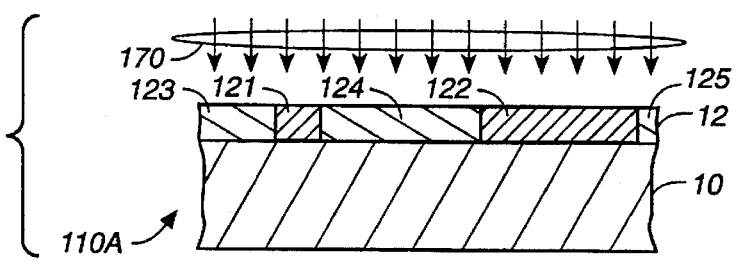
*FIG._3C*
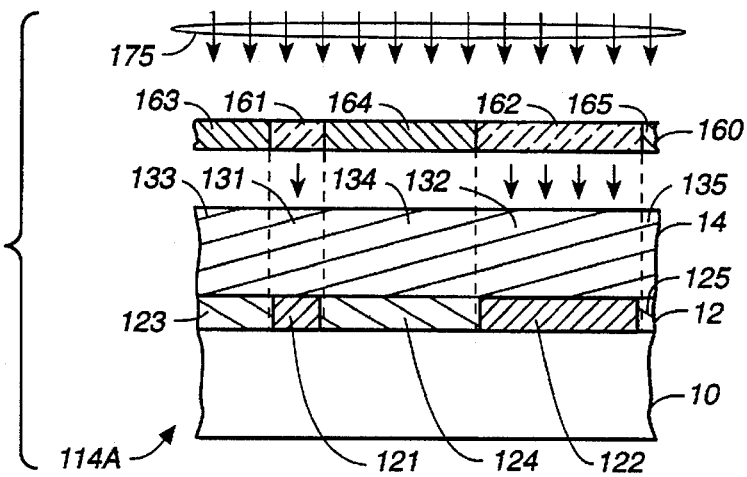
*FIG._3D*
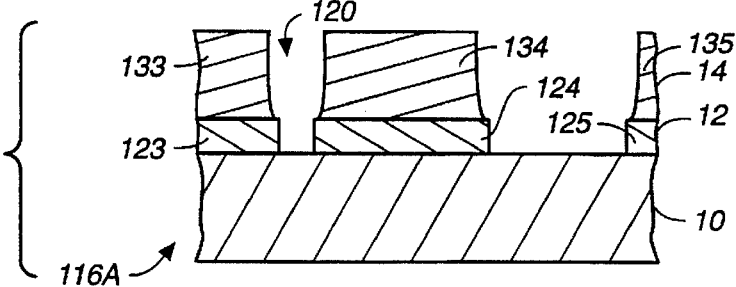
*FIG._3E*

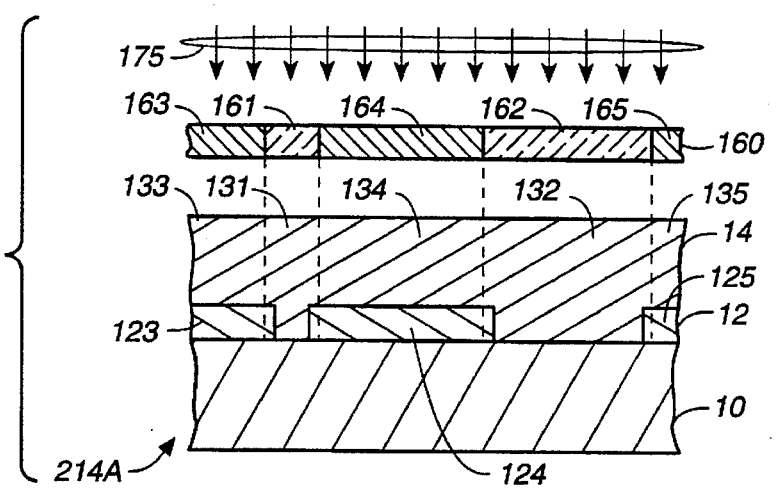
FIG._4A
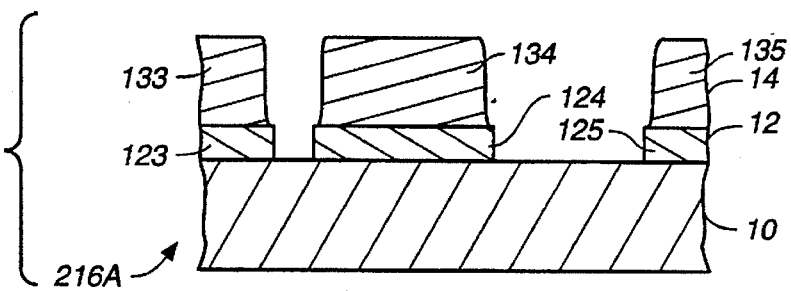
FIG._4B
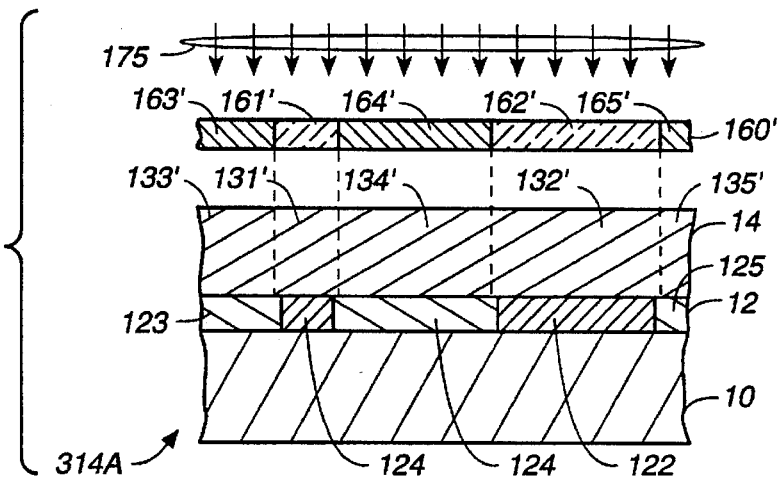
FIG._5A
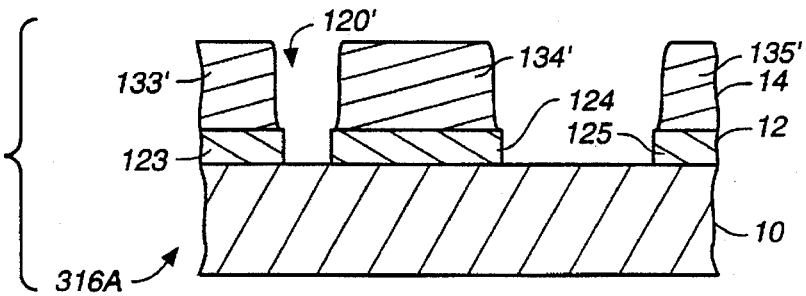
FIG._5B

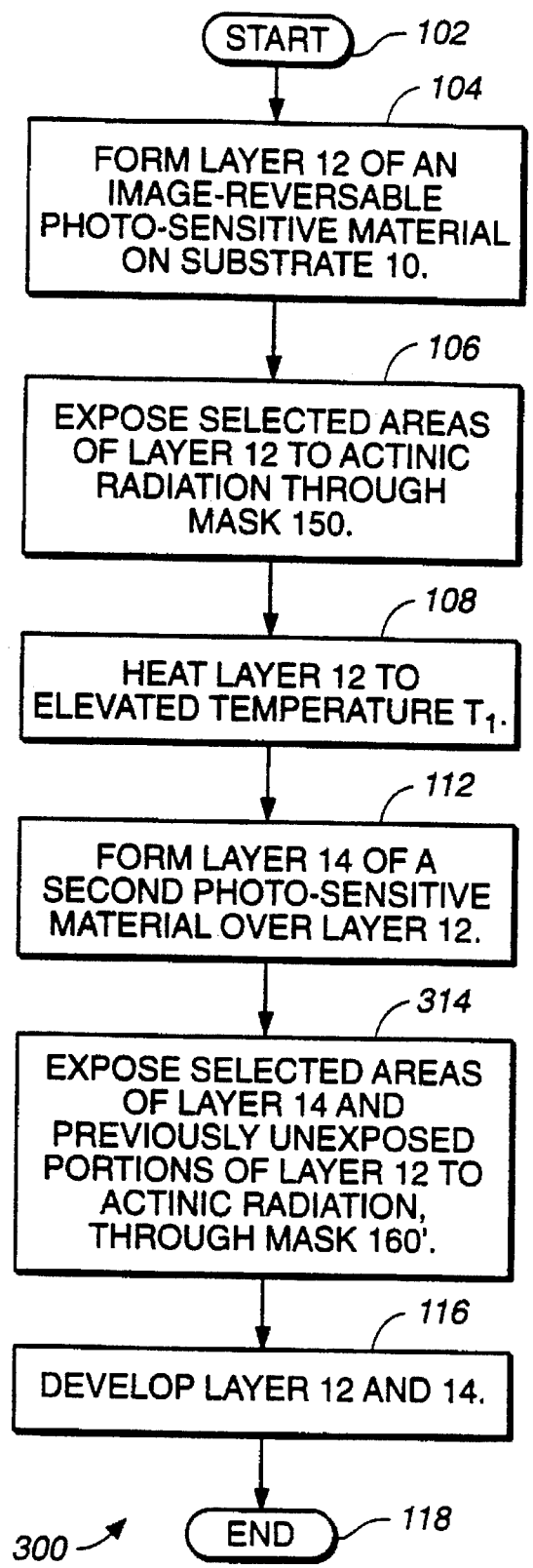
FIG._5

METHODS OF FORMING TALL, HIGH-ASPECT RATIO VIAS AND TRENCHES IN PHOTO-IMAGEABLE MATERIALS, PHOTORESIST MATERIALS, AND THE LIKE

FIELD OF THE INVENTION

The present invention generally relates to processing and fabrication methods for integrated-circuit chip packaging technology, and to the use of photo-imageable layers, such as photo-sensitive layers and photo-resist layers. More particularly, the present invention relates to methods of forming relatively tall (>~5 μm), high-aspect ratio (>~2:1) via structures in photo-imageable layers such as photoresists and the like, disposed on a supporting substrate.

BACKGROUND OF THE INVENTION

In the integrated-circuit (I.C.) chip packaging industry, photo-imageable materials, such as photoresists, photo-imageable polyimide, and other photo-imageable dielectrics, are used to form patterns on substrates, such as for example semiconductor wafers, and on the various material layers that may be disposed on the substrates. Of interest to this disclosure are the well known trench and via patterns, which are voids formed in a material layer (e.g., photoresist) disposed on the substrate. The material within the trench and via structures is removed, and often replaced by a different material. FIG. 1 shows several examples of trench structures formed in a material layer 11, which is disposed on a substrate 10. Various trench structures are shown at 20, 30, 40, and 50. Various via structures are shown at 60 (cylindrical) and 70 (square-shaped). As is known in the art, via and trench structures may be combined to form other geometrical structures. For example, the well known "dog-bone" structure is shown at 80 in FIG. 1.

A typical application of a via (or trench) structure may be found in the construction of an electrical coupling between two parallel metal layers which are separated by an insulating dielectric material. A first metal layer is initially formed on the substrate, followed by the formation of the insulating material. Vias are then formed in the insulating layer. If the layer is photo-sensitive, the vias may be formed by patterned exposure to actinic radiation followed by dissolving in a developer solution. Alternatively, the material with the vias may be removed by a wet etch or dry etch process (e.g., plasma or reactive-ion etching) through an etch mask. Next in this typical application, a second metal layer is disposed over the insulating layer, filling the voids of the vias (or trenches) and making contact to the first metal layer. Alternatively, metal may first be formed within the vias before the deposition of the second metal layer. In many applications, the insulating material is left on the substrate. In some applications, the insulating material is removed (as for example as done in forming "air-bridges").

The present invention is directed to forming trench and via structures in photo-imageable materials, such as for example photoresists. Photoresists, as well as all photo-image, able materials, are generally classified into two groups: positive type materials and negative type materials. Positive-type materials become soluble in a developer solution (e.g., alkaline-aqueous solution) when exposed to light radiation, usually ultraviolet. Negative-type materials become insoluble in a developer solution (e.g., an organic solvent) when exposed to light radiation. In either case, the light generally must be within a given range of wavelengths, the range being a function of the chemical and optical properties of the particular photo-imageable material. Light within the wavelength range is often referred to as "actinic" radiation. As used herein, actinic radiation for a given material is any electromagnetic radiation having a wavelength capable of activating that material.

A typical negative photoresist comprises a synthetic polymer resin (e.g., cyclized polyiosoprene rubber), a photo-initiator chemical (e.g., azide compounds), and a solvent base. The solvent base dissolves the resin and initiator chemical, which are usually solid or near solid. This enables the photoresist to readily coat a desired substrate (e.g., semiconductor wafer, ceramic substrate) to form a photoresist layer thereon. After coating, the solvent is evaporated from the substrate by exposure to moderate heat ("soft bake"), leaving the resin and photo-initiator as a hard layer.

The resin of a negative-type photoresist generally comprises polymer chains, each chain having one or more unsaturated carbon bonds. With sufficient energy, unsaturated bonds from two such chains may be bonded to form a saturated carbon bond. This cross links the chains and, in combination with other cross-links to other chains, renders the photoresist substantially insoluble in a selected organic solvent. The energy is generally provided by way of the photo-initiator chemical. Upon exposure to actinic radiation, the molecules of the photo-initiator absorb energy from the radiation and interact with chains to form cross links. Some resins are capable of cross-linking without the aid of a photo-initiator and are directly responsive to the actinic radiation.

A typical positive photoresist comprises a resin, a photo-sensitizer chemical, and a solvent base. As before, the solvent base dissolves the resin and sensitizer chemical, and is evaporated after the wafer has been coated to form a layer thereon. The resin's polymer chains are normally insoluble in alkaline-aqueous solutions. Upon exposure to actinic radiation, the molecules of the photo-sensitizer decompose into acidic products which, in the present of an alkaline-aqueous solution, promote the dissolving of the polymer chains. The exposed portions of the positive-type photoresist then become soluble in an alkaline aqueous solution.

In use, a typical photoresist (either positive or negative type) is coated on the wafer to form a photoresist layer, soft-baked to remove the solvent base from the layer, and then exposed to actinic radiation through a mask. The mask transfers its pattern to the photoresist layer. The photoresist layer is then developed by exposure to an appropriate developer solution. For a negative photoresist, the unexposed portions of photoresist dissolve in the developer solution. For a positive photoresist, the exposed portions dissolve. A pattern is then left on the wafer for further processing. Once the remaining photoresist layer is no longer needed, it may be removed by exposure to an organic solvent called a stripper.

Within approximately the last five years, a few positive-type photoresists have been developed which can reverse their exposed images. These resists are called Image Reversal (or Reversing) Photoresists (IRP's), or dual tone resists. They are classified as positive resists because their chemical structure is closer to that of positive photoresists rather than that of negative photoresists. In an unexposed state, the IRP materials are insoluble in alkaline aqueous solutions. After exposing an IRP material to actinic radiation though a mask, the exposed portions become soluble in an alkaline aqueous solution. The unexposed portions remain insoluble. The IRP material may then be developed as a positive resist. In the alternative, the resist may be heated to a temperature of around 100° C.–160° C. to render the exposed portions insoluble. By then exposing the previously unexposed portions to the actinic radiation, the previously unexposed portions are rendered soluble in the alkaline aqueous solution. Accordingly, the initial mask image is reversed, and may be developed to form a negative image of the mask.

In this reversal process, the second exposure to actinic radiation may expose the entire layer rather than just the previously unexposed portions. The type of exposure is called a "blank flood exposure" in the processing art. Due to the heat treatment, the initially exposed portions remain insoluble, even if exposed to the actinic radiation in the second exposure.

At present, photoresist and photo-imageable materials, including IRP materials, are generally limited in their ability to define high-aspect ratio via structures. Due to optical diffraction effects which occur during the exposure of actinic radiation through the mask, the aspect ratio in typical photo-sensitive materials is generally limited to a maximum of 2:1 (height:width). Additionally, it is difficult to control the dimensions at the bottom of a patterned structure in photo-sensitive materials when the aspect ratio is 2:1 or more. The control of the bottom dimension is critical in many applications because such vias are intended to contact small features on the layers or substrates below.

Some advanced photo-imaging processing materials and techniques, such as contrast enhancement materials (CEMs), can achieve aspect ratios higher than 2:1, but are generally limited to relatively moderate heights. For CEMs, the aspect ratio that can be achieved is inversely related to the height that can be achieved. Typical CEMs can achieve a 3:1 aspect ratio at a maximum height of 25 µm to 30 µm, with the maximum height decreasing as the desired aspect ratio increases. Dry etching methods using multi-layer resist/mask structures can achieve aspect ratios greater than 2:1, but they are expensive and relatively complicated, and it is often difficult to control etch dimensions and uniformity with these methods. Additionally, these dry etching methods have not yet been adequately developed or proven for etch depths greater than approximately 10 µm. Dry etching mask materials having higher etch selectivity than those currently available will be required for depths greater than 10 µm.

Accordingly, there is a need for a simple and economical method for forming tall structures, such as vias and trenches, having high-aspect ratios with photoresist and photo-sensitive materials. There is also a need for a simple and economical method of controlling the bottom dimensions of high aspect-ratio structures.

SUMMARY OF THE INVENTION

Broadly stated, the present invention encompasses a method of forming tall, high-aspect ratio structures in a material layer comprising a first layer of a first photo-sensitive material and a second layer of a second photo-sensitive material which is different than the first. The structures according to the present invention have aspect ratios greater than approximately 2:1, and preferably greater than approximately 3:1, and preferably have heights greater than approximately 3 µm. The first layer preferably comprises an image reversing photo-sensitive material, and the second layer preferably comprises a positive-type photo-sensitive material. The first and second layers are formed, exposed and developed such that the formation, exposure, and development of each layer does not substantially modify or destroy the patterns formed in the other layer. Such a method is simple and more economical than using CEM materials or dry etching methods. Additionally, the formation, exposure, and development of the first layer of the methods of the present invention provides good control of the bottom dimensions of high aspect-ratio structures.

In one embodiment of the present invention, a first layer of an image reversal (IRP) photo-sensitive material is formed on a substrate. The layer is then exposed to actinic radiation through a mask which comprises the complimentary image, or negative, of the desired high-aspect ratio structure, i.e., the area overlying the location of the desired structure is not exposed to the radiation. If the first layer were next developed, this unexposed area would be insoluble while the exposed areas would be soluble. However, in the first embodiment of the present invention, the exposed image is first reversed before developing, thereby rendering the unexposed area soluble and the exposed areas insoluble. The reversal may be accomplished by first heating the IRP layer to an elevated temperature to render the exposed portions insoluble, and then by exposing the entire wafer to actinic radiation (e.g., blank flood exposure) to render the previously unexposed portions soluble.

A second layer of a positive type photo-sensitive material, which is chemically compatible with the IRP layer, is then formed over the first layer, exposed to actinic radiation, and developed without modifying or destroying the pattern formed in the first layer. In contrast with the first layer, the second layer is exposed to actinic radiation through a second mask which comprises the positive image of the desired high-aspect ratio structure.

In a second embodiment of the present invention one or more high-aspect ratio structures are formed using a first photo-sensitive material and a second photo-sensitive material. The first photo-sensitive material comprises the property of being rendered soluble in a developer solution when exposed to actinic radiation having a wavelength in a first range, and the property of being rendered insoluble in the same developer solution when heated to an elevated temperature after being exposed to the actinic radiation (first wavelength range). The second photo-sensitive material comprises the property of being rendered soluble in the developer solution when exposed to actinic radiation having a wavelength in a second predetermined wavelength range.

The method according to the second embodiment comprises the steps of forming a first layer of the first photo-sensitive material on a substrate, and exposing the first layer to actinic radiation such that a first set of selected areas of the first layer are exposed to actinic radiation. The remaining unexposed areas of the first layer form a second set of areas, such that each desired high aspect-ratio structure will be formed over a corresponding area of the second set. The method further comprises the step of heating the first photo-sensitive layer to the elevated temperature such that substantially all of the first set of areas are rendered substantially insoluble in the developer solution. This step locks in the bottom dimensions of the patterns surrounding the desired high aspect-ratio structures. Thereafter, the method exposes the second set of areas to actinic radiation such that they can be dissolved by the developer solution. This step enables the second areas to be removed to form the desired high aspect-ratio structures. The exposure step may occur immediately subsequent to the heating step, as for example by a blank flood exposure, or may occur when the second photo-sensitive material is exposed at a later step, as described below. After the exposure step, the first layer may be developed before processing of the second photo-sensitive material or concurrent with the development of the second material, as described below.

The method according to the second embodiment further comprises the steps of forming, after the step of exposing the first set of areas in the first layer to actinic radiation, a second layer of the second photo-sensitive material over the first photo-sensitive layer, and selectively exposing the second layer to actinic radiation. The selected areas of the second layer which are exposed to actinic radiation are referred to as the third set of selected areas. The remaining unexposed areas of the second layer form a fourth set of selected areas. The third set is aligned with corresponding areas of said second set of said first photo-sensitive layer. Thereafter the second layer is developed in the developer solution to dissolve the third set of selected areas. This step, and the step of developing the first layer, dissolve the second and third sets of selected areas to form the one or more high-aspect ratio structures.

It may be appreciated that, as a means of reducing the number of processing steps, the first and second layers may be developed concurrently. Additionally, it may be appreciated that, with the second and third sets of areas being aligned, areas of the third set may be designed to substantially cover corresponding areas of the second step. Accordingly, if the first and second photo-sensitive materials are responsive to a common wavelength of actinic radiation, the step of exposing the second set of areas to actinic radiation may be performed concurrently with the step of exposing the third set of areas to actinic radiation in order to reduce the number of processing steps.

Accordingly, it is an object of the present invention to provide a simple and economical method of forming tall, high aspect-ratio (greater than 2:1) structures, such as trenches and vias, in photo-imageable materials.

It is another object of the present invention to provide a method of forming high aspect-ratio structures having improved control over the bottom dimensions of such structures.

It is another object of the present invention to provide a method of forming tall, high aspect-ratio structures in photo-imageable materials without the need for complicated plasma etching or reactive-ion etching steps.

It is yet another object of the present invention to provide a method of forming tall, high aspect-ratio structures in photo-imageable materials with a minimal number of processing steps.

These and other objects of the present invention will become apparent to those skilled in the art from the following detailed description of the invention, the accompanying drawings, and the appended claims.

BRIEF DESCRIPTION OF THE DRAWINGS

FIG. 1 is a perspective view of a substrate and a material layer showing various configuration of via and trench structures.

FIG. 2 is a cross-sectional view of an exemplary tall, high aspect-ratio structure according to the present invention.

FIG. 3 is a flow diagram of a first embodiment of the method according to the present invention for forming high aspect-ratio structures.

FIG. 4 is a flow diagram of a second embodiment of the method according to the present invention for forming high aspect-ratio structures.

FIG. 5 is a flow diagram of a third embodiment of the method according to the present invention for forming high aspect-ratio structures.

DETAILED DESCRIPTION OF THE INVENTION

A cross-sectional view of an exemplary tall, high aspect-ratio structure according to the present invention is shown at 120 in FIG. 2. Hereinbelow, and in the claims, the term high aspect ratio is intended to comprise aspect ratios greater than approximately 2:1, and preferably ratios greater than approximately 3:1. Structure 120 is formed within a material comprising a first layer 12 and a second layer 14, second layer 14 being disposed upon layer 12. Layer 12 is, in turn, disposed upon the top surface of a substrate 10. Substrate 10 may, for example, comprise materials such as silicon, ceramic, alumina, suitable metals (e.g., copper), or other suitable substrate material. As described below in greater detail, each of layers 12 and 14 comprises a photo-sensitive material which may be patterned by exposure to actinic radiation. It may be appreciated that other layers may be disposed and processed on substrate 10 before layers 12 and 14 are formed, and that the methods according to the present invention are not limited to forming layers 12 and 14 directly on top of substrate 10.

In the cross-section shown in FIG. 2, structure 120 comprises a height H and a width D. Width D is taken at the smallest width in the cross-section of structure 120, which preferably occurs within layer 12. The cross-section of structure 120 shown in FIG. 2 is the cross-section having the smallest width D for structure 120. The aspect ratio of structure 120 is defined to be the height H divided by the width D: H/D. In other words, the aspect ratio is defined to be the height over the smallest cross-sectional width of structure 120. The present invention may be used to achieve aspect ratios on the order of 2:1 or more with heights on the order of 5 microns or more, and to preferably to achieve aspect ratios on the order of 3:1 or more with heights on the order of 10 microns or more. In preferred embodiments of the present invention, layer 14 has a larger thickness than layer 12, typically between 1.5 and 5 times the thickness of layer 12.

Structure 120 may be utilized for a number of applications. One preferred application is to use structure 120 to form a conductive post which is coupled to substrate 10 at one end and which may be coupled to an opposing substrate at the other end. In such an exemplary application, a metal interconnect layer is first disposed and patterned on substrate 10 such that a metal pad is formed where structure 120 is to be formed. Layers 12 and 14 are then formed. Next a metal is deposited within structure 120, for example by electroplating, sputtering, or chemical vapor deposition (CVD). Layers 12 and 14 may then be removed, leaving a conductive post formed within the original volume of structure 120. Substrate 10 may comprise active electrical circuitry which is coupled to the conductive post, or may comprise a "wire trace" which couples the post to another similarly constructed post.

First layer 12 preferably comprises an image-reversing photo-sensitive material (IRP). The IRP material of layer 12 has a property of being rendered soluble in a developer solution when exposed to actinic radiation. This property is similar to that of positive-type photo-sensitive materials. By exposing the material of layer 12 to actinic radiation through a mask, a pattern may be formed which may be later developed as in a normal positive-type photo-sensitive material. The IRP material of layer 12 further comprises the property of being rendered insoluble in the same developer solution when heated to an elevated temperature after being exposed to the actinic radiation. Accordingly, a pattern previously exposed on first layer 12 may be rendered insoluble, instead of soluble, by heating to the elevated temperature. By next exposing the previously unexposed portions to the actinic radiation, the image may be reversed, producing an image which is the compliment of the image first formed on layer 12. The material of layer 12 preferably further comprises the property that the exposed and heated portions are insensitive to further exposure to radiation. This enables a simple blank flood exposure of layer 12 to be used for the second exposure step.

Second layer 14 preferably comprises a positive-type photo-sensitive material which is chemically compatible with first layer 12 (i.e., it does not mix with or dissolve first layer 12). The material of layer 14 has the property of being rendered soluble in a developer solution, preferably the same developer solution as first layer 12, when exposed to actinic radiation, such as ultra-violet light. As this property is also found in the material of layer 12, layer 14 may comprise the IRP material of layer 12.

In general, commercially available IRP materials are chemically compatible (i.e., do not mix with or dissolve) with positive photoresists, and are therefore preferred for layer 12. At present, commercially available negative resists are generally not chemically compatible with positive resists, and are therefore currently not preferred for layer 12. Additionally, positive photoresist materials currently provided better resolution for thick films than commercially available negative resists.

Exemplary materials for layer 12 are the AZ5200® positive photoresist series manufactured by the Hoechst Corporation and the KTI-875™ dual tone resist manufactured by the KTI Chemicals Corporation. The AZ5200 series of photoresists includes the AZ5206, the AZ5210, and the AZ5214 photoresists. The photoresists in the 5200 series differ in their solids content and their viscosity, each being optimized to achieve a specific range of thicknesses. The AZ5200 series of photoresists are sensitive to actinic radiation, having a wavelength in the range of 300 nanometers to 500 nanometers. The AZ5200 series of photoresists may be made to image reverse by exposure to an elevated temperature, after initial actinic radiation exposure, of between 100° C. to 150° C. The KTI-875 dual tone resist is sensitive to actinic radiation in a wavelength range from approximately 300 nanometers to approximately 450 nanometers, and may be made to image reverse by exposure to an elevated temperature in the range of approximately 110° C. to 130° C.

Exemplary photo-sensitive materials for second layer 14 may be found in the AZ4000® series of photoresists. This series includes the AZ4330, the AZ4400, the AZ4620, and the AZ4901 photoresist materials. These photoresists vary in solids, content and viscosity, each being optimized to achieve a specific range of thickness. These photoresists comprise the property of being rendered soluble in a developer solution when exposed to actinic radiation having a wavelength in the range of 300 nanometers to 600 nanometers. In an exemplary preferred embodiment of the present invention, the second layer comprises the AZ4620 photoresist and the first layer comprises one of either the AZ5214 or KTI-875 photoresist materials. Second layer 14 may also comprise a resist from the AZ5200 series (IRP). However, the AZ5200 series currently costs more than the AZ4000 series, and is therefore currently not preferred for low-cost applications.

The above AZ4000 series and AZ5200 (IRP) series of photo-sensitive materials may be developed by the AZ Developer® solution, the AZ4000K® developer solution, or most of the other commercially available positive photoresist developer solutions. When layers 12 and 14 respectively comprise an AZ5200 series material and an AZ4000 material, they may be concurrently developed by any one of these solutions. The KTI-875 resist may be developed by the AZ Developer, the KTI-934 (70%), or the KTI-SB-351 (2.5:1) developer solutions. When layers 12 and 14 respectively comprise the KTI-875 material and an AZ4000 material, they may be developed concurrently by the AZ Developer. Alternatively, the layers may be developed concurrently by first developing the AZ4000 material in a suitable developer and then developing the KTI-875 material in one of the KTI-934 or the KTI-SB-351 developer solutions.

FIG. 3 shows a flow diagram 100 of a method for forming high aspect-ratio structures, such as structure 120, according to a first embodiment of the present invention. Flow diagram 100 comprises a number of blocks 102–118, proceeding from one block to the next in sequential numerical order. Flow diagram 100 begins at block 102 with substrate 10. At block 104, layer 12 of the image reversible photo-sensitive material is formed on substrate 10. The material may be formed by spin coating, spray coating, or dip coating, all of which are well-known in the art. Layer 12 is then preferably soft-baked at an elevated temperature (generally 80° C.–100° C.) for a sufficient amount of time (depending upon thickness) to remove the solvent from the photo-sensitive material, as is known in the art. A partial cross-sectional view of substrate 10 and layer 12 after the processing of block 104 is shown at 104A in FIG. 3-1. In order to more clearly show the features of layers 12 and 14, the vertical dimension of substrate 10, i.e., its thickness, has been relatively shrunk in the drawings shown in FIG. 3-1.

In the preferred embodiments of the present invention, layers 12 and 14 are each formed with thicknesses greater than approximately 1 μm, for a total thickness of greater than approximately 2 μm. In a preferred embodiment of the present invention, layer 12 is formed with a thickness of between approximately 4 μm and approximately 12 μm. For thicknesses between 1 μm and 6 μm, layer 12 may be formed by a single application (e.g., spin and soft-bake) of the KTI-875 material. For thicknesses between 6 μm and 12 μm, layer 12 may be formed by two applications of the KTI-875 material. For thicknesses between 1 μm and 3 μm, layer 12 may be formed by a single application of one of the AZ5200 series materials.

At block 106, selected areas of layer 12 are exposed to actinic radiation through a first mask 150. This step is illustrated in a partial cross-sectional view shown at 106A in FIG. 3-2. The actinic radiation is shown at 170 and is generated by a source (not shown). Actinic radiation 170 is directed towards layer 12 in a direction generally normal to the plane of substrate 10. Mask 150 is disposed between the source of actinic radiation 170 and layer 12, and comprises opaque areas 151 and 152, and clear areas 153–155. First mask 150 comprises the negative image of the desired patterns of the high aspect-ratio structures. As described below, the image transformed by mask 150 will be reversed. Accordingly, actinic radiation 170 penetrates areas of layer 12 which underlie clear areas 153–155, but does not substantially strike areas of layer 12 underlying opaque areas 151 and 152. Those areas of layer 12 underlying opaque areas 153–155 are labeled in FIG. 3-2 as areas 123–125, respectively. Those areas of layer 12 underlying opaque areas 151 and 152 are labeled as areas 121 and 122, respectively. Exposed areas 123–125 of layer 12 comprise a first set of selected areas, whereas the remaining unexposed areas 121 and 122 comprise a second set of areas. Dashed lines are shown within layer 12 to show the extent of the exposed regions in areas 121 and 122.

At block 108, layer 12 is heated to an elevated temperature $T_1$ for sufficient time to cause the exposed image to be reversed in layer 12. Before this heat exposure, the areas 123–125 would be soluble in a suitable developer. However, after the heat exposure, areas 123–125 are rendered substantially insoluble in the developer's solution. The material in areas 121 and 122 are not affected by the heat operation, because they were previously not exposed to actinic radiation, and remain insoluble in the developer.

At block 110, areas 121 and 122, which were previously unexposed, are now exposed to actinic radiation to render these areas soluble to the developer. The exposure to actinic radiation may be performed through a mask having a complimentary pattern to mask 150 or, preferably, may be performed by a blank flood exposure in which the entire layer is exposed to actinic radiation. The latter is easier and may be performed if the image reversed areas of layer 12 (i.e., areas 153–155) will not be caused to lose their insolubility due to the exposure. A partial cross-sectional view of substrate 10 and layer 12 during a blank flood exposure is shown at 110A in FIG. 3-3.

At block 112, layer 14 of a second photo-sensitive material is formed over layer 12. This step preferably comprises forming the photoresist on the wafer and soft baking as described above with respect to first layer 12. The material may be formed by spin coating, spray coating, or dip coating. Layer 14 may be formed with a thickness of between approximately 4 μm and approximately 50 μm, or more. In one embodiment of the present invention, layer 14 has a thickness between ~30 μm and ~40 μm and layer 12 has a thickness of between ~8 μm and ~12 μm, for a total thickness of between ~38 μm and ~52 μm.

For thicknesses between 1 μm and 20 μm, layer 14 may be formed by a single application (e.g., spin and soft-bake) of the AZ4620 material. For thicknesses between 20 μm and 40 μm, layer 14 may be formed by two applications of the AZ4620 material. As is well known in the photoresist art, the thickness of a layer of a photo-sensitive material depends upon the characteristics of the material (e.g., viscosity), the spin speed, the spin time, the characteristics of the coating machine, and the characteristics of the surface upon which the material is being formed. As is commonly done in the art, sets of different spin speeds and times are tested for the specific material, machine and wafer/substrate to find one or more such sets which yield a desired thickness.

Additionally, it is known in the art that dynamically dispensing the material on the wafer or substrate may by used to improve the uniformity of the layer's thickness. In dynamic dispensing, the nozzle which dispenses the photo-sensitive material is moved across the wafer, rather than being fixed at the center of the wafer. The wafer or substrate is usually spun at low speed during dispensing, and then spun at a higher speed to achieve a desired thickness. The degree of uniformity usually depends upon the motion of the nozzle during dispensing, the spin speed during dispensing, the later spin speed, and the other parameters identified above. As is commonly done in the art, sets of different spin speeds, times, nozzle paths are tested for the specific material, machine and wafer/substrate to find one or more such sets which yield a desired uniformity. It has been found that moving the nozzle from the wafer's edge to its center at a low speed of between 200–1000 RPM within 10–30 sec, followed by a high speed spin between 2000–5000 RPM may be useful in achieving 15 μm to 20 μm thick layers of the AZ4620 material.

At block 114, selected areas in layer 14 are exposed to actinic radiation through a second mask 160. These areas will be referred to as the third set of selected areas. This step is illustrated in a partial cross-sectional view of substrate 10 and layers 12 and 14 at 114A in FIG. 3-4. The radiation is shown by arrows 175. Actinic radiation 175 is generated by a source (not shown) and is directed towards layer 14 in a direction generally normal to the plane of substrate 10. Mask 160 comprises a positive image of the desired patterns of the high aspect-ratio structures and is substantially complimentary to first mask 150. Specifically, mask 160 comprises clear areas 161 and 162, which generally overlie areas 121 and 122 of layer 12, and opaque areas 163–165, which generally overlie areas 123–125 of layer 12. Layer 14 comprises areas 133–135 underlying opaque areas 163–165 of second mask 160. As a result of the exposure, areas 131 and 132 of second layer 14, which generally overly areas 121 and 122 of layer 12, are rendered soluble in the developer solution.

At block 116, layers 12 and 14 are developed, which causes areas 121, 122, 131, and 132 to be substantially dissolved and removed. Areas 123–125 and 133–135 substantially remain. The cross-sectional view of substrate 10 and layers 12 and 14 after this step is shown at 116A in FIG. 3-5. As a result, high aspect-ratio structure 120 is formed within the removed areas 121 and 131.

Accordingly, it may be appreciated that one or more high aspect ratio structures may be formed by forming layers 12 and 14 on substrate 10, exposing layers 12 and 14 to selected patterns of actinic radiation, and developing layers 12 and 14 such that the formation, exposure, and development of each layer does not substantially modify or destroy the patterns formed in the other layer.

By way of contrast, forming two layers of the same positive-type photo-resist material would not achieve a structure having a high aspect-ratio. This is because the exposure of the top layer to actinic radiation in such an approach would re-expose the first layer and would result in widening the pattern previously formed in the first layer. The widening is caused by diffraction of the actinic radiation by the second mask which propagates through the second layer to the first layer, and by sufficient misalignment between first and second masks to enable the second mask to expose previously unexposed portions of the first layer. In the present invention, the heat treatment of the IRP layer effectively locks in the pattern dimensions in the first layer, making the dimensions substantially immune to further actinic radiation exposure. Accordingly, the above-described diffraction and misalignment effects do not substantially effect the patterns in the first layer of the present invention.

Although layers 12 and 14 are developed at the same time of block 116 in method 100, first layer 12 may be developed before the formation and processing of second layer 14. Specifically, first layer 12 may be developed after the second exposure at block 110 and before the formation of layer 14 at block 112. This alternative is shown at 200 in FIG. 4 as a flow diagram of a second embodiment of the method according to the present invention. Flow diagram 200 comprises the same blocks 102–118 of flow diagram 100 shown in FIG. 3 with the exception of an additional block 111, which occurs between blocks 110 and 112. Flow diagram 200 proceeds through blocks 102–110 as described above in respect to flow diagram 100. However, in this alternative embodiment, after block 110 flow diagram 200 proceeds to block 111, where first layer 12 is developed, causing areas 121 and 122 to be removed. Thereafter, second layer 14 is formed at block 112, as described above. A cross-sectional view of substrate 10 and layers 12 and 14 at the end of this step is shown at 214A in FIG. 4-1. As can be seen at 214A, the material of second layer 14 is formed within the removed areas 121 and 122.

At block 114, selected areas of layer 14 are exposed to actinic radiation 175, as described above, through mask 160. The exposure step is shown at 214A. At block 116, layer 14 is developed to remove areas 131 and 132. A cross-sectional view of substrate 10 and layers 12 and 14 at the end of this step is shown at 216A in FIG. 4-2.

Method 200 comprises an additional step at block 111, and therefore may involve more cost and time than method 100. However, method 200 enables two different developer solutions to be used in the case where the materials of layers 12 and 14 cannot be developed by a common developer. Additionally, method 200 readily enables the same developer solution to be used for layers 12 and 14 under two separate conditions to optimize the development of each layer. As in known in the art, the use of different processing conditions, such as for example different developer concentrations and/or different temperatures, may be used to optimize the horizontal/vertical edge selectivity of the developer solution to provide a desired wall profile of the developed structure (e.g., via, trench).

In another alternative to the sequence of steps of method 100, the blank flood exposure at block 110 may be eliminated and performed by the subsequent exposure of the second layer 14 at block 114, provided that the materials of layer 12 and 14 are responsive to one or more common wavelengths of actinic radiation. As indicated previously, masks 150 and 160 are substantial compliments of one another. Mask 150 comprises the negative image of the desired patterns of the high aspect-ratio structures, whereas mask 160 comprises the positive image thereof. The result of block 110 is to expose the previously unexposed areas of layer 12 to actinic radiation. With proper design of mask 160, this step may be performed when second layer 14 is exposed to actinic radiation at block 114. Thus, by designing clear areas 161 and 162 of second mask 160 to correspond to areas 121 and 122 of second layer 12, areas 121 and 122 may be completely exposed to actinic radiation.

FIG. 5 shows a flow diagram 300 showing this alternative method. Flow diagram 300 comprises blocks 102–108, 112, 116, and 118 of method 100, and a block 314 which is a modification of block 114 of method 100. Blocks 102 through 108 proceed in sequence as in method 100. After layer 12 is heat treated at block 108, flow diagram 300 proceeds to block 112 to form layer 14, skipping the exposure step of block 110. After layer 14 is formed at block 112, selected areas of layer 14 and previously unexposed portions of layer 12 are exposed to actinic radiation through a mask 160' at block 314. Mask 160' comprises areas 161' through 165' which correspond in nature to areas 161 through 165 of second mask 160. (In other words, areas 161'–162' are clear and areas 163'–165' are opaque.) However, areas 161' and 162' are designed to ensure that previously unexposed areas 121 and 122 are exposed. The design accounts for any misalignment between masks 150 and 160' that may occur and for any light diffusing effects that may occur at the edges of areas 161' and 162'. A cross-sectional view of substrate 10 and layers 12 and 14 during the exposure of block 314 is shown at 314A in FIG. 5-1. As a result of the exposure, areas 131' and 132' are rendered soluble, with areas 133'–135' remaining insoluble in the developer.

After block 314, flow diagram 300 proceeds to block 116, where layers 12 and 14 are developed, as above. A cross-sectional view of substrate 10 and layers 12 and 14 at the end of this step is shown at 316A in FIG. 5-2.

Currently, there are a number of photo-sensitive materials which can be used to practice the present invention. Given the state of the art, it appears likely that a wider array of positive-type and IRP type photo-sensitive materials which can be used to practice the present invention will become available in the future, and such materials should be construed to be within the scope of the present invention, which is not directed to any particular material. Additionally, it may be appreciated that some standard positive-type photoresists may be processed to have image reversal properties, as for example by post-exposure baking in ammonia gas. Additionally, alternative treatments to standard positive-type photo-sensitive materials may be developed in the future. Such uses of positive-type photoresists and photo-sensitive materials should also be construed to be within the scope of the present invention.

While the present invention has been particularly described with respect to the illustrated embodiment, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of forming one or more structures having an aspect ratio greater than 3:1 and a height greater than approximately 3 µm with a first layer of a first photo-sensitive material and a second layer of a second photo-sensitive material different from said first photo-sensitive material, said method comprising the steps of forming said layers on a substrate with said second layer being disposed upon said first layer, exposing said layers to selected patterns of actinic radiation, and developing said layers to form said one or more structures such that the formation, exposure, and development of each layer does not substantially modify or destroy the patterns formed in the other layer, and such that each layer has a thickness greater than 1 µm and such that the thickness of said second layer is greater than the thickness of said first layer.

2. A method of forming one or more high-aspect ratio structures with a first layer of a first photo-sensitive material and a second layer of a second photo-sensitive material, said first material comprising an image reversal photo-sensitive material, said method comprising the steps of: forming said layers on a substrate with said first layer formed over said substrate, exposing said layers to selected patterns of actinic radiation, image reversing said first layer, and developing said layers to form said one or more high-aspect ratio structures such that the formation, exposure, and development of each layer does not substantially modify or destroy the patterns formed in the other layer.

3. The method of claim 2 wherein said image reversal photo-sensitive material is rendered soluble in a developer solution when exposed to actinic radiation and rendered insoluble in said developer solution when image reversed, and wherein said second photo-sensitive material is rendered soluble in said developer solution when exposed to actinic radiation.

4. The method of claim 3 wherein each layer has a thickness greater than 1 µm.

5. A method of forming one or more high-aspect ratio structures, comprising the steps of:

(a) forming a first layer of a first photo-sensitive material on a substrate, said first photo-sensitive material being rendered soluble in a developer solution when exposed to actinic radiation and being rendered insoluble in said developer solution when heated to an elevated temperature after being exposed to actinic radiation;

(b) exposing said first photo-sensitive layer to actinic radiation such that a first set of selected areas of said first layer are exposed to said actinic radiation, the remaining unexposed areas of said first layer forming a second set of areas;

(c) heating said first photo-sensitive layer to said elevated temperature such that substantially all the previously-exposed selected areas of said first set are rendered substantially insoluble in said developer solution;

(d) thereafter exposing said second set of areas to actinic radiation such that substantially all the previously-unexposed selected areas of said second set are soluble in said developer solution;

(e) developing said first photo-sensitive layer in said developer solution, said solution dissolving said second set of areas to partially form said one or more high-aspect ratio structures, said first photo-sensitive layer being developed provided that said second set of areas of said first photo-sensitive layer have been previously exposed to actinic radiation;

(f) forming a second layer of a second photo-sensitive material over said first photo-sensitive layer, said second material being of the type which is rendered soluble in said developer solution when exposed to actinic radiation, said second photo-sensitive layer being formed provided that said first layer has been previously exposed to actinic radiation to form said first set of selected areas;

(g) exposing said second layer to actinic radiation such that a third set of selected areas of said second layer are exposed to said actinic radiation, the remaining unexposed areas of said second layer forming a fourth set of selected areas, said third set of selected areas being aligned with said second set of selected areas of said first photo-sensitive layer; and (h) thereafter, developing said second photo-sensitive layer in said developer solution, said solution dissolving said third sets of areas, said steps of developing said first and second layers dissolving said second and third sets to form said one or more high-aspect ratio structures.

6. The method of claim 5 wherein said first layer is developed when said second layer is developed.

7. The method of claim 5 wherein said first layer is developed before said second layer is developed.

8. The method of claim 5 wherein said second set of areas is exposed when said third set of areas is exposed.

9. The method of claim 5 wherein said second layer is formed with a thickness larger than the thickness of said first layer.

10. The method of claim 9 wherein said first layer has a thickness between approximately 8 μm and approximately 12 μm, and wherein said second layer has a thickness between approximately 30 μm and approximately 40 μm.

11. The method of claim 5 wherein said developer solution comprises an alkaline aqueous solution.

12. The method of claim 5 wherein one of said one or more high aspect-ratio structures comprises a via.

13. A method of forming one or more high-aspect ratio structures, comprising the steps of:

forming a first layer of a first photo-sensitive material on a substrate, said first photo-sensitive material being rendered soluble in a developer solution when exposed to actinic radiation and being rendered insoluble in said developer solution when heated to an elevated temperature after being exposed to actinic radiation;

exposing said first photo-sensitive layer to actinic radiation such that a first set of selected areas of said first layer are exposed to said actinic radiation, the remaining unexposed areas of said first layer forming a second set of areas;

heating said first photo-sensitive layer to said elevated temperature such that substantially all the previously-exposed selected areas of said first set are rendered substantially insoluble in said developer solution;

thereafter exposing said second set of areas to actinic radiation such that substantially all the previously-unexposed selected areas of said second set are soluble in said developer solution;

forming a second layer of a second photo-sensitive material over said first photo-sensitive layer, said second material being of the type which is rendered soluble in said developer solution when exposed to actinic radiation;

exposing said second layer to actinic radiation such that a third set of selected areas of said second layer are exposed to said actinic radiation, the remaining unexposed areas of said second layer forming a fourth set of selected areas, said third set of selected areas being aligned with said second set of selected areas of said first photo-sensitive layer; and thereafter developing each of said first and second photo-sensitive layers in said developer solution, said solution dissolving said second and third sets of areas to form said one or more high-aspect ratio structures.

14. The method of claim 13 wherein said first and second photo-sensitive layers are developed simultaneously.

15. The method of claim 13 wherein said second photoresist layer is formed with a thickness larger than the thickness of said first photoresist layer.

16. A method of forming one or more high-aspect ratio structures, comprising the steps of:

forming a first layer of a first photo-sensitive material on a substrate, said first photo-sensitive material being rendered soluble in a developer solution when exposed to actinic radiation and being rendered insoluble in said developer solution when heated to an elevated temperature after being exposed to actinic radiation;

exposing said first photo-sensitive layer to actinic radiation such that a first set of selected areas of said first layer are exposed to said actinic radiation, the remaining unexposed areas of said first layer forming a second set of areas;

heating said first photo-sensitive layer to said elevated temperature such that substantially all the previously-exposed selected areas of said first set are rendered substantially insoluble in said developer solution;

thereafter exposing said second set of areas to actinic radiation such that substantially all the previously-unexposed selected areas of said second set are soluble in said developer solution;

developing said first photo-sensitive layer in said developer solution, said solution dissolving said second set of areas to partially form said one or more high-aspect ratio structures;

forming a second layer of a second photo-sensitive material over said first photo-sensitive layer, said second material being of the type which is rendered soluble in said developer solution when exposed to actinic radiation;

exposing said second layer to actinic radiation such that a third set of selected areas of said second layer are exposed to said actinic radiation, the remaining unexposed areas of said second layer forming a fourth set of selected areas, said third set of selected areas being aligned with said second set of selected areas of said first photo-sensitive layer; and thereafter, developing said second photo-sensitive layer in said developer solution, said solution dissolving said third sets of areas, said steps of developing said first and second layers dissolving said second and third sets to form said one or more high-aspect ratio structures.

17. The method of claim 16 wherein said second photoresist layer is formed with a thickness larger than the thickness of said first photoresist layer.

18. A method of forming one or more high-aspect ratio structures, comprising the steps of:

forming a first layer of a first photo-sensitive material on a substrate, said first photo-sensitive material being rendered soluble in a developer solution when exposed to actinic radiation and being rendered insoluble in said developer solution when heated to an elevated temperature after being exposed to actinic radiation;

exposing said first photo-sensitive layer to actinic radiation such that a first set of selected areas of said first layer are exposed to said actinic radiation, the remaining unexposed areas of said first layer forming a second set of areas;

heating said first photo-sensitive layer to said elevated temperature such that substantially all the previously-exposed selected areas of said first set are rendered substantially insoluble in said developer solution;

forming a second layer of a second photo-sensitive material over said first photo-sensitive layer, said second material being of the type which is rendered soluble in said developer solution when exposed to actinic radiation;

simultaneously exposing said second layer and said second set of areas of said first layer to actinic radiation such that substantially all the previously-unexposed selected areas of said second set are soluble in said developer solution, and such that a third set of selected areas of said second layer are exposed to said actinic radiation, the remaining unexposed areas of said second layer forming a fourth set of selected areas, said third set of selected areas being aligned with said second set of selected areas of said first photo-sensitive layer; and thereafter developing each of said first and second photo-sensitive layers in said developer solution, said solution dissolving said second and third sets of areas to form said one or more high-aspect ratio structures.

19. The method of claim 18 wherein said second photoresist layer is formed with a thickness larger than the thickness of said first photoresist layer.

20. The method of claim 19 wherein said first and second photo-sensitive layers are developed simultaneously.

* * * * *